United States Patent [19]
Heinecke et al.

[11] Patent Number: 5,304,887
[45] Date of Patent: Apr. 19, 1994

[54] CRYSTAL RESONATOR DEVICE

[75] Inventors: Rudolf A. H. Heinecke; Roger J. Williamson, both of Harlow, United Kingdom

[73] Assignee: Northern Telecom Limited, Montreal, Canada

[21] Appl. No.: 920,807

[22] Filed: Jul. 28, 1992

[30] Foreign Application Priority Data

Oct. 19, 1991 [GB] United Kingdom ............... 9122245

[51] Int. Cl.⁵ ..................... H01L 41/09; H01L 41/18
[52] U.S. Cl. ........................... 310/361; 310/369
[58] Field of Search ............... 310/346, 320, 367–369, 310/361, 348, 344, 320

[56] References Cited

U.S. PATENT DOCUMENTS

| | | | |
|---|---|---|---|
| Re. 26,707 | 11/1969 | Cutler et al. | 310/346 |
| 3,617,780 | 11/1971 | Benjaminson et al. | 310/346 |
| 4,057,770 | 11/1977 | Henningsen et al. | 331/94.5 Q |
| 4,135,108 | 1/1979 | Besson | 310/344 |
| 4,221,986 | 9/1980 | Besson | 310/344 |
| 4,317,059 | 2/1982 | Besson | 310/361 |
| 4,334,168 | 6/1982 | Besson et al. | 310/343 |
| 4,405,875 | 9/1983 | Nagai | 310/344 |
| 4,848,643 | 7/1989 | Frische et al. | 310/346 |

FOREIGN PATENT DOCUMENTS

| | | | |
|---|---|---|---|
| 2547458 | 12/1984 | France | 310/340 |
| 0057009 | 2/1990 | Japan | 310/369 |
| 2202989B | 10/1988 | United Kingdom | H01L 41/04 |
| 2202989A | 10/1988 | United Kingdom | H01L 41/04 |

*Primary Examiner*—Thomas M. Dougherty
*Attorney, Agent, or Firm*—Lee, Mann, Smith, McWilliams, Sweeney & Ohlson

[57] ABSTRACT

A resonator comprises a quartz resonator element (11) sealed between a pair of flat quartz housing members (12, 13) the resonator comprises an active central region 110 defined by an annular recess 111 within which vibrational energy is trapped. The crystal orientation of the housing may be aligned with that of the resonator to minimise thermal effects.

2 Claims, 1 Drawing Sheet

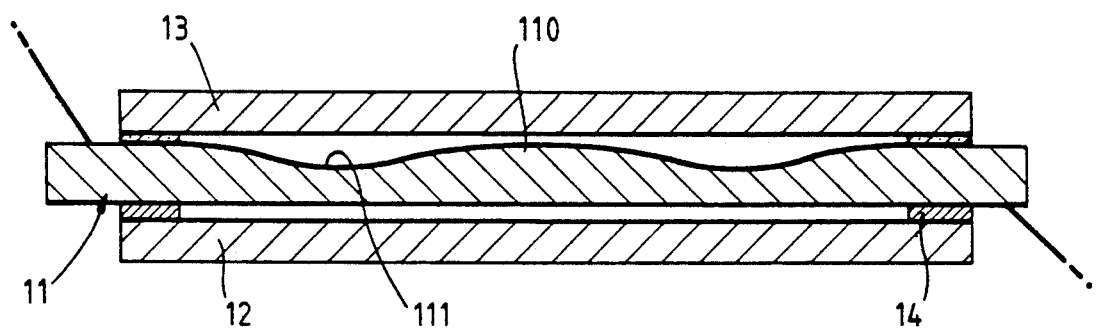

CRYSTAL RESONATOR DEVICE

This invention relates to quartz crystal resonators and in particular to resonators suitable for high frequency close tolerance applications.

BACKGROUND OF THE INVENTION

A low loss quartz resonator typically comprises a quartz plate of suitable crystal orientation or cut driven via electrodes disposed on either side of the plate. It has been found that by thickening the electroded portion of the plate, either by metallising the electrodes or by providing the plate with a convex contour, it is possible to trap the mechanical vibration within the electrode region so as to provide a low loss device. The device can be mounted via its edge or rim without significant interference with the vibration of its active region. Typically the device is mounted at discrete points using spring clips and a silver loaded resin whereby electrical contact to the device is effected.

Such a design has a number of problems. The frequency of the device is inversely proportional to its thickness and is thus sensitive to the presence of surface films such as water or organic materials. It is for this reason that close tolerance devices are hermetically sealed either in vacuum or in a dry nitrogen atmosphere. However, it has been found that the silver loaded region used for contacting the device is a source of trace organic materials which cause ageing of the device.

Typically the trapped vibrational mode of the device is a thickness shear mode. However, such a mode is inevitably associated with flexural vibrations which are not trapped and hence reach the edge of the device. With conventional discrete point mounts, these vibrations are partially reflected back into the resonator area. At certain frequencies these interfere constructively to produce whole-plate resonances. These resonances can be close together in frequency as well as having poor temperature coefficients. The result is that as their frequency passes through the frequency of the wanted trapped resonance, they interfere with that resonance and cause 'activity dips' with an associated frequency glitch. Furthermore, slight variations in the boundary conditions at the edge of the plate can cause large changes in the frequencies of these plate resonances, and hence the temperatures at which they interfere with the main mode. This leads to thermal hysteresis which causes problems with temperature compensated crystal oscillators.

Another major problem with conventional discrete point mounting is the vibration sensitivity of the final device. In theory if the mount was completely symmetrical, and the vibration was placed at the centre of symmetry, then the vibration sensitivity vanishes in all three axes. However, in practice this is very difficult to achieve because of the difficulty in placing the silver loaded resin or other mounting structures at the precise point required.

The object of the invention is to minimise or to overcome these disadvantages.

One approach to the above problem is to mount the device in a quartz package. This technique is discussed in our specification No. 2202989B which describes and claims a crystal resonator assembly, including a crystal resonator, and first and second housing members mated together to define a cavity in which the resonator is located, wherein the housing members are formed from the same crystal material and hence the same crystal orientation as the resonator.

Whilst this structure has proved satisfactory in operation, the manufacture of the housing members within which the resonator is encapsulated represents a significant process cost.

SUMMARY OF THE INVENTION

According to the present invention there is provided a quartz crystal resonator device, including a resonator element and first and second housing members, wherein the resonator element comprises a quartz plate having a contoured central portion surrounded by a annular recess whereby vibrational energy is trapped in the central portion, and wherein said housing members comprise each a flat quartz plate secured to the respective surface of the resonator element at its periphery.

BRIEF DESCRIPTION OF THE DRAWINGS

An embodiment of the invention will now be described with reference to the accompanying drawings in which the single FIGURE is a cross-sectional view of the quartz packaged resonator device.

DESCRIPTION OF PREFERRED EMBODIMENT

Referring to the drawing, the device comprises a quartz resonator element 11 mounted between a pair of flat quartz housing plates 12, 13. The resonator element 11 comprises a quartz plate which is contoured in its generally central region to define a convex or lens-shaped region 110 surrounded by an annular recess 111. The geometry, i.e. the depth and radius of curvature of the recess, is defined so as to ensure trapping of the preferred thickness-shear vibrational mode within the region 110. Preferably the recess and the contoured surface are symmetrical about the centre of the resonator plate.

The resonator element 11 may be contoured by a radio frequency plasma etching process.

The rim of the resonator element 11 is of the same thickness as the central region 110. This permits the use of flat sealing plates 12, 13 secured to the periphery of the element 11 by a hermetic seal 14 formed e.g. from a low melting point glass or a metal alloy. The thickness of the seal 14 determines the separation between the plates 12, 14 and the active region of the resonator element 11. As the seal is wholly inorganic the problem of contaminant emission is eliminated. In some applications the seal may comprise an electrostatic bond or a diffusion bond.

The sealing process is conducted at elevated temperatures, e.g. 400° to 500° C., and under reduced pressure or vacuum.

The outer surface of one or both of plates 12 may provide a substrate e.g. for a film circuit to provide an integral oscillator package.

Advantageously the inner surface of the plates 12, 13 and both surfaces of the resonator element 11 are coated with gold to effect balanced molecular flexes between surfaces. The gold coating of the element 11 also provides the driver electrodes.

The plates 12, 13 are aligned with respect to their crystal orientation with the resonator element 11 so as to substantially eliminate thermal mismatch. The crystal cuts used for the resonator element are typically AT-cuts or SC-cuts, the latter being a doubly rotated cut with a number of advantages such as stress compensation. SC-cut devices are however more expensive to manufacture. The angular rotation around the X-axis determines the thermal expansion coefficient in the plane of the plate. As this angle is the same for both the SC-cut and the lower cost AT-cut, it is possible to use AT-cut housing plates together with an SC-cut resonator element.

The packaged structure has low vibration sensitivity in the two lateral directions. Low sensitivity in the thickness direction is ensured by maintaining the contour and hence the vibrational distribution symmetrically about the centre of the contour of the resonator plate 11.

Flexural modes generated by the excitation of the trapped thickness-shear mode will inevitably reach the edge of the resonator plate. By virtue of the hermetic seal around the boundary of the resonator plate, this energy will be coupled into the two sealing plates 12, 13. By appling a suitable acoustic e.g. a plastics film absorber 15 to the outside surfaces of these plates, these flexural waves are prevented from being reflected back into the resonator plate. In this way troublesome activity dips and their effected on thermal hysteresis are substantially eliminated. We have also found that roughening the outer surfaces of the plate 12 provides effective acoustic absorption.

The gold applied to the inner surfaces of the sealing plates 12, 13 can be used to fine adjust the device to frequency. A controlled laser beam directed through such a plate evaporates gold from the surface so that the gold 16 is deposited on the surface of the resonator plate. This extra gold increases the mass loading on the resonator plate and hence reduce its frequency.

The structure may be mounted in a plastics package containing a shock-absorbing foam.

It will be appreciated that the technique described above can be employed in the construction of filters which comprise a number of resonators appropriately coupled together. It is possible to fabricate a number of such resonators on a single monolithic resonator plate with either electrical or acoustic coupling between the individual resonators. Such multiple resonators suitably connected can then be sealed by quartz plates, as described above, to make a filter. Alternatively, any number of single or multiple resonators can be aligned and stacked on top of one another using the same sealing process for the package with closure plates supplying the outer layers of the devices. Such a device can be connected either as a filter or as a number of isolated resonators for applications which require a number of frequencies.

We claim:

1. A packaged quartz crystal resonator device, including a resonator element and first and second housing members, the resonator element comprises a quartz plate formed from SC-cut material and having a contoured central portion surrounded by an annular recess whereby vibrational energy is trapped in the central portion, wherein said housing members comprise each a flat quartz plate of AT-cut material secured to the respective surface of the resonator element at its periphery via a low-melting-point glass or a low-melting-point alloy, wherein said housing members are aligned with respect to their crystal orientation with the resonator element so as to minimise thermal mismatch therebetween, wherein both the surfaces of the resonator element and the inwardly facing surfaces of the housing members are coated with gold, and wherein the outer surface of one or both said housing members is provided with an acoustic absorbing layer.

2. A resonator device as claimed in claim 1, wherein the space surrounding the resonator element is evacuated.

* * * * *